United States Patent
Syed et al.

(10) Patent No.: US 11,988,555 B1
(45) Date of Patent: May 21, 2024

(54) CONFIGURABLE SENSOR UNITS AND SENSOR APPARATUS

(71) Applicant: International Business Machines Corporation, Armonk, NY (US)

(72) Inventors: Ghazi Sarwat Syed, Zurich (CH); Urs Egger, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/164,663

(22) Filed: Feb. 6, 2023

(51) Int. Cl.
  *G01J 1/44* (2006.01)
(52) U.S. Cl.
  CPC ........................................ *G01J 1/44* (2013.01)
(58) Field of Classification Search
  CPC ....... G01J 1/44; G11C 13/004; G11C 13/0069
  See application file for complete search history.

(56) References Cited

U.S. PATENT DOCUMENTS

| | | | | |
|---|---|---|---|---|
| 9,911,490 | B2 * | 3/2018 | Ge ..................... | G11C 13/0007 |
| 10,970,441 | B1 | 4/2021 | Zhang | |
| 2018/0166134 | A1 * | 6/2018 | Zidan ................. | G11C 13/0007 |
| 2019/0027217 | A1 * | 1/2019 | Strachan ............ | G11C 13/0026 |
| 2020/0265909 | A1 | 8/2020 | Matsuura | |

FOREIGN PATENT DOCUMENTS

| | | |
|---|---|---|
| TW | 202131329 A | 8/2021 |
| WO | 2022221836 A1 | 10/2022 |

OTHER PUBLICATIONS

Angizi et al., "PISA: A Binary-Weight Processing-In-Sensor Accelerator for Edge Image Processing", arXiv:2202.09035v1 [cs.AR] Feb. 18, 2022, 11 pages.

Camunas-Mesa et al., "An Event-Driven Multi-Kernel Convolution Processor Module for Event-Driven Vision Sensors", Oct. 2011, 13 pages.

Hsu et al., "A 0.5-V Real-Time Computational CMOS Image Sensor With Programmable Kernel for Feature Extraction", IEEE Journal of Solid-State Circuits, vol. 56, No. 5, May 202, 9 pages.

(Continued)

*Primary Examiner* — Georgia Y Epps
*Assistant Examiner* — Don J Williams
(74) *Attorney, Agent, or Firm* — Monchai Chuaychoo

(57) ABSTRACT

Configurable sensor units and sensor apparatus are provided. A configurable sensor unit comprises a sensor device for generating an electrical signal, dependent on a stimulus sensed by the device, in a circuit, and a programmable non-volatile memory element operable in the circuit as a load resistor for the sensor device, whereby resistance of the load resistor depends on a programmed state of the memory element. The sensor unit has an output for providing an output signal dependent on the aforementioned electrical signal and programmed state. Sensor apparatus may comprise a plurality of these configurable sensor units. Such sensor apparatus may be configured to perform in-sensor compute operations for neural network architectures. Further sensor apparatus comprises a configurable sensor unit and a controller for programming the memory element of the sensor unit to a programmed state dependent on an operating requirement for the sensor unit.

25 Claims, 7 Drawing Sheets

(56) References Cited

OTHER PUBLICATIONS

Lee et al., "Programmable black phosphorus image sensor for broadband optoelectronic edge computing", Nature Communications | (2022) 13:1485 | https://doi.org/10.1038/s41467-022-29171-1, 8 pages.

Liu et al., "On-Sensor Binarized Fully Convolutional Neural Network with A Pixel Processor Array", arXiv:2202.00836v1 [cs.CV] Feb. 2, 2022, 15 pages.

Mennel et al., "Ultrafast machine vision with 2D material neural network image sensors", Nature, vol. 579, Published online: Mar. 4, 2020, 16 pages, <https://doi.org/10.1038/s41586-020-2038-x>.

Pantho et al., "Towards an Efficient CNN Inference Architecture Enabling In-Sensor Processing", Sensors 2021, 21, 1955, https://doi.org/10.3390/s21061955, Published Mar. 10, 2021, 20 pages.

Song et al., "A Reconfigurable Convolution-in-Pixel CMOS Image Sensor Architecture", arXiv:2101.03308v2 [eess.IV] Oct. 13, 2021, IEEE Transactions on Circuits and Systems for Video Technology, Sep. 2021, 13 pages.

International Search Report and Written Opinion, International Application No. PCT/IB2023/063410, International Filing Date Dec. 30, 2023.

Li et al., "Analogue signal and image processing with large memristor crossbars", Nature Electronics, vol. 1, Jan. 2018, pp. 52-59.

\* cited by examiner

CONFIGURABLE SENSOR UNITS AND SENSOR APPARATUS

BACKGROUND

The present invention relates generally to configurable sensor units and sensor apparatus incorporating such sensor units.

Sensors are employed in numerous applications in science, technology and the Internet of Things (IoT). Sensors (such as image, audio, motion, temperature, chemical and tactile sensors) can be deployed in multiple environments and are used to detect a wide range of stimuli (light, sound, motion, etc.) for many purposes. Outputs of such sensors can be processed in various ways and are often processed in neural network (NN) architectures designed to perform cognitive tasks. As an illustrative example, static or video images can be analyzed by NN systems designed to detect objects, people, human emotions, and so on. Processing of sensor outputs can involve various types of computation. In NN systems, for instance, sensor outputs are converted to digital signals which are then propagated over weighted connections in the network. Signal propagation typically involves computations such as multiply-accumulate (MAC) and matrix-vector multiplication (MVM) operations in which signals are multiplied by network weights according to the particular network architecture. Such computations involve multiple data transfers between memory and processing units and require significant processing resources.

In-memory compute (IMC) architectures have been proposed in which certain computational tasks, such as MAC and MVM operations, can be performed in situ in computational memory units employing arrays of memory cells. This alleviates the processing bottleneck due to data movements between memory and processing units, improving computational efficiency. In a similar vein, image sensors based on two-dimensional materials have been proposed for in-sensor MVM operations (see "Ultrafast machine vision with 2D material neural network image sensors", Mennel et al., Nature 579, 62-66 (2020)) and convolution operations for edge detection (see "Programmable black phosphorous image sensor for broadband optoelectronic edge computing", Seokhyeong et al., Nature Communications 13, 1485 (2022)). In these image sensors, NN weights are stored by tuning photoresponsivity of 2D-material photosensor devices using a field effect to modulate the channel doping via charge stored in multigate electrodes or gate dielectric layers of the devices. These systems require sophisticated device architectures and lack the scalability required for image sensor applications.

Improvements to sensors, and also sensor apparatus with compute functionality, would be highly desirable.

SUMMARY

A configurable sensor unit and sensor apparatus are provided. A configurable sensor unit comprises a sensor device for generating an electrical signal, dependent on a stimulus sensed by the device, in a circuit, and a programmable non-volatile memory element operable in the circuit as a load resistor for the sensor device, whereby resistance of the load resistor depends on a programmed state of the memory element. The sensor unit has an output for providing an output signal dependent on the aforementioned electrical signal and programmed state. Sensor apparatus may comprise a plurality of these configurable sensor units. Such sensor apparatus may be configured to perform in-sensor compute operations for neural network architectures. Further sensor apparatus comprises a configurable sensor unit and a controller for programming the memory element of the sensor unit to a programmed state dependent on an operating requirement for the sensor unit.

Another aspect of the invention provides sensor apparatus comprising a plurality of configurable sensor units as described above. The plurality of sensor units may be arranged in a cross-bar array having row and column lines for addressing respective rows and columns of sensor units to obtain the output signal from each unit.

DETAILED DESCRIPTION

Figure 1:
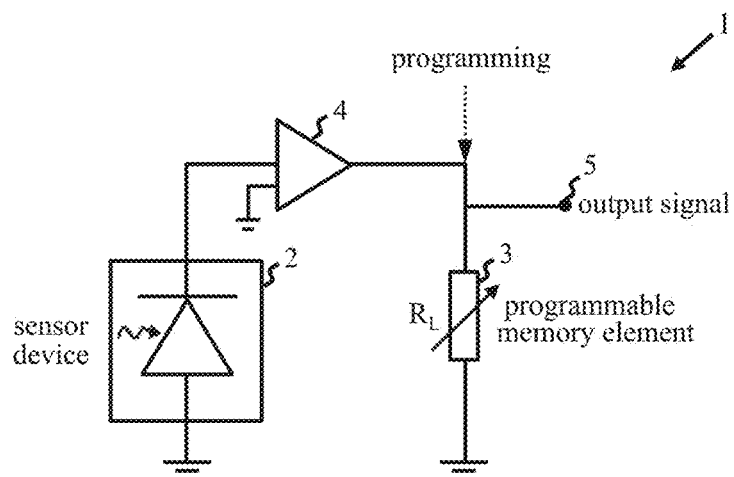
FIG. 1 is a schematic representation of one embodiment of a configurable sensor unit.

A first aspect of the present invention provides a configurable sensor unit. The sensor unit comprises a sensor device for generating an electrical signal, dependent on a stimulus sensed by the device, in a circuit, and a programmable non-volatile memory element operable in the circuit as a load resistor for the sensor device, whereby resistance of the load resistor depends on a programmed state of the memory element. The sensor unit has an output for providing an output signal dependent on the aforementioned electrical signal and programmed state.

By using a programmable non-volatile memory element as a load resistor for the sensor device, sensor units embodying the invention can be configured in an elegantly simple manner and can be programmed, one-time or dynamically, for various purposes. Using the memory element as a load resistor allows computation to be performed directly on the signal generated by the sensor device, whereby both sensing (signal generation) and computation (via the programmable load resistance) are performed locally without data conversions. Responsivity of sensor units can be configured as desired and is then preserved, in the non-volatile state of the load resistor, for subsequent sensor operation. With this simple and efficient device structure, sensor units can be easily adapted for different operating conditions and/or application requirements. This structure also provides the basis for efficient, highly scalable computational sensor apparatus with functionality for performing in-sensor computations such as MAC and MVM operations in NN architectures.

Sensor units can include switching circuitry for selectively connecting the memory element in the sensor circuit and to a controller for programming the memory element to a required programmed state. Using the same basic unit structure, different sensor units can be programmed one-time for different operating conditions and/or application requirements, or units may be programmed dynamically, e.g., to adapt to varying operating conditions or for in-sensor compute applications.

In particularly advantageous embodiments, the sensor unit includes a plurality of programmable non-volatile memory elements which are operable in the circuit as a load resistor for the sensor device. The memory elements may be selectively connectable in the circuit, with the unit including switching circuitry for connecting a selected memory element in the circuit in response to a control signal. These embodiments offer switching between different, individually programmable load resistors for adapting sensor units to different operating conditions/application requirements and/or to implement more complex in-sensor computations, e.g., for convolutional NN (CNN) architectures.

Another aspect of the invention provides sensor apparatus comprising a plurality of configurable sensor units as described above. The plurality of sensor units may be arranged in a cross-bar array having row and column lines for addressing respective rows and columns of sensor units to obtain the output signal from each unit. This offers a highly efficient system architecture for various types of sensor apparatus, such as image sensors or tactile sensors, where sensor units are spatially distributed. The sensor apparatus can include a controller for controlling addressing of sensor units via the row and column lines and for programming memory elements of the sensor units.

Using sensor units with a plurality of memory elements operable as load resistors offers computational sensor apparatus for accelerating processing of sensor signals in CNNs. The controller of such apparatus is operable to program memory elements of each sensor unit to programmed states corresponding to respective kernel weights of a CNN layer, and to control addressing of sensor units such that output signals of the sensor units provide results of a convolution operation in the CNN layer. In an advantageous embodiment here, the output signal of each sensor unit is provided to a column line of the cross-bar array of sensor units. The controller is operable to control addressing of sensor units and selective connection, via the control signal for each sensor unit, of each of the memory elements in the circuit of that unit such that signals on the column lines of the array provide results of multiply-accumulate steps of a convolution operation in the CNN layer. This allows in-sensor computation by switching between load resistors in sensor units to switch-in kernel weights required for convolution, and MAC operations can be performed by addressing units in parallel. Multiple MAC operations may also be performed in parallel in some architectures. The sensor units may also include, for each memory element, a capacitor for storing a charge dependent on the electrical signal from the sensor device and the programmed state of that memory element, the capacitor being selectively connectable to the output to provide the output signal of the sensor unit. This allows temporary storage of output signals and greater flexibility for processing of signals in a required order for convolution.

Figure 2:
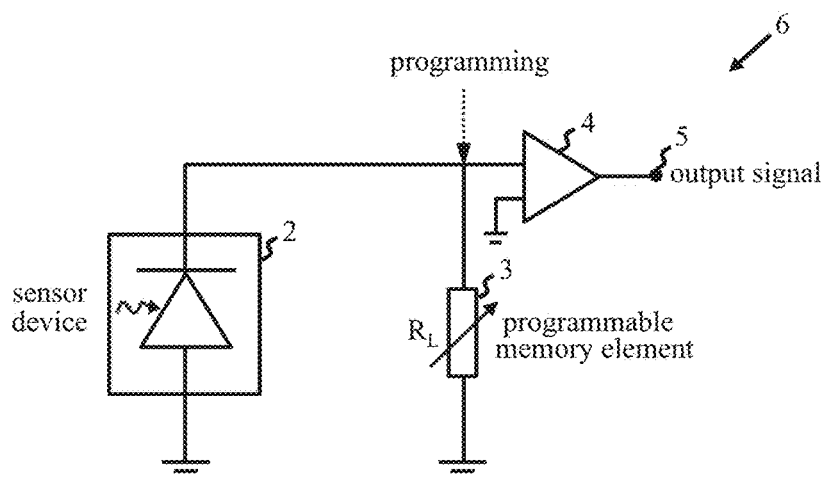
FIG. 2 is a schematic representation of another embodiment of the sensor unit.

FIG. 1 shows basic circuit components of a configurable sensor unit (CSU) embodying the invention. The CSU 1 has a sensor device 2 for generating an electrical signal, dependent on a stimulus sensed by the device, in the sensor circuit. In this example, the sensor device 2 comprise a photosensor, here a photodiode, which generates an electrical signal in response to incident light. The CSU also includes a programmable non-volatile memory element 3 which is operable in the circuit as a load resistor $R_L$ for the sensor device 2. The resistance of the load resistor $R_L$ depends on a programmed state of the memory element 3. The value of $R_L$ can be set via a programming operation as indicated schematically in the figure. In this embodiment, the memory element 3 is connected in series with sensor 2 via an amplifier 4 for amplifying the sensor output. The CSU has an output 5 for providing an output signal dependent on the electrical signal from sensor 2 and the programmed state of memory element 3. In this example, the signal at output 5 is determined by the voltage dropped across load resistor $R_L$ due to the (amplified) photocurrent generated by photodiode 2. FIG. 2 (in which elements shown in FIG. 1 are indicated by like reference numerals) shows a similar embodiment of a CSU. In this CSU 6, the amplifier 4 is positioned at the output to amplify the voltage generated across load resistor $R_L$.

Figure 3:
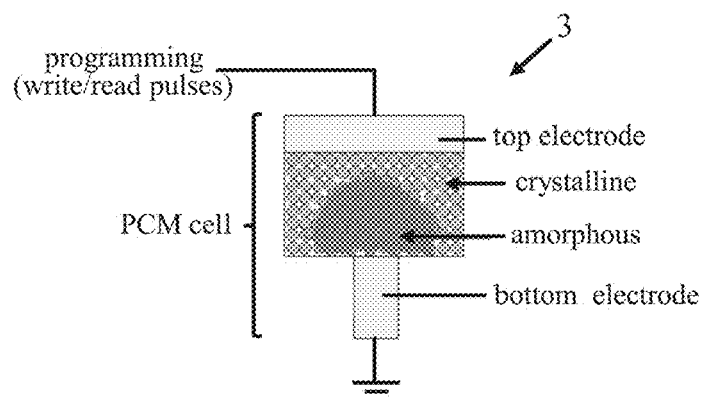
FIG. 3 shows an example of a programmable non-volatile memory element of the sensor units.

The programmable memory element 3 can be implemented using a variety of known memory technologies. FIG. 3 shows a particularly convenient example. Here, the memory element is implemented by a mushroom-type PCM cell. The PCM cell comprises a volume of phase change material, such as GST (Germanium Antimony Tellurium) between top and bottom electrodes of the cell. The cell can be programmed to different analog resistance states by application of voltage pulses ("write" pulses) via the electrodes to vary the proportions of amorphous and crystalline phases, which have different resistive properties, within the phase-change material. The resistance state of the cell can be read during programming by applying a "read" pulse, of sufficiently low voltage that the cell-state is unaffected, and measuring resulting current flow through the cell. By applying such programming signals, the PCM memory element 3 can be programmed to a desired resistance value $R_L$. A memory element 3 may also be implemented using other non-volatile memory devices such as NAND flash cells, FeFET cells, and resistive RAM (RRAM, or ReRAM) cells including conductive bridge RRAM cells, oxide or metal-oxide RRAM cells, carbon RRAM cells, and magneto-resistive random access memory (MRAM) cells or ferro-electric random access memory (FeRAM) cells. One or more of such cells may be arranged in various circuit configurations to provide a programmable-resistance memory element 3.

Figure 4:
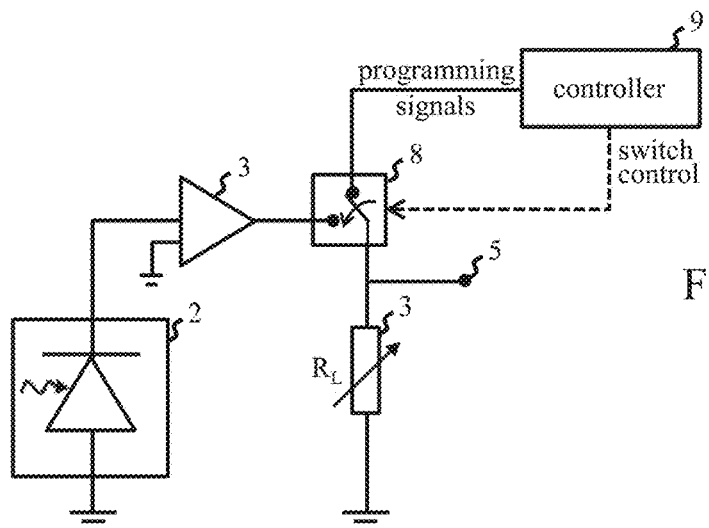
FIG. 4 shows an embodiment of a sensor unit with switching circuitry for a programming operation.

During programming, the memory element 3 may be decoupled from the sensor device 2. This is illustrated in FIG. 4 for the basic circuit configuration of FIG. 1. Here, the CSU includes switching circuitry 8 for selectively connecting the memory element 3 in the sensor circuit and to a controller 9 for programming the memory element to a required state.

Providing the programmable memory element 3 as a load resistor for the sensor device allows responsivity of the CSU to be tuned in a particularly simple manner. A memory element 3 can be programmed to a required state, one-time or dynamically, allowing configuration/reconfiguration of individual CSUs as desired for various purposes. Exemplary applications are described in more detail below. Responsivity of CSUs can be configured as required and is then preserved, in the non-volatile state of the memory element 3, for subsequent sensor operation.

Figure 5:
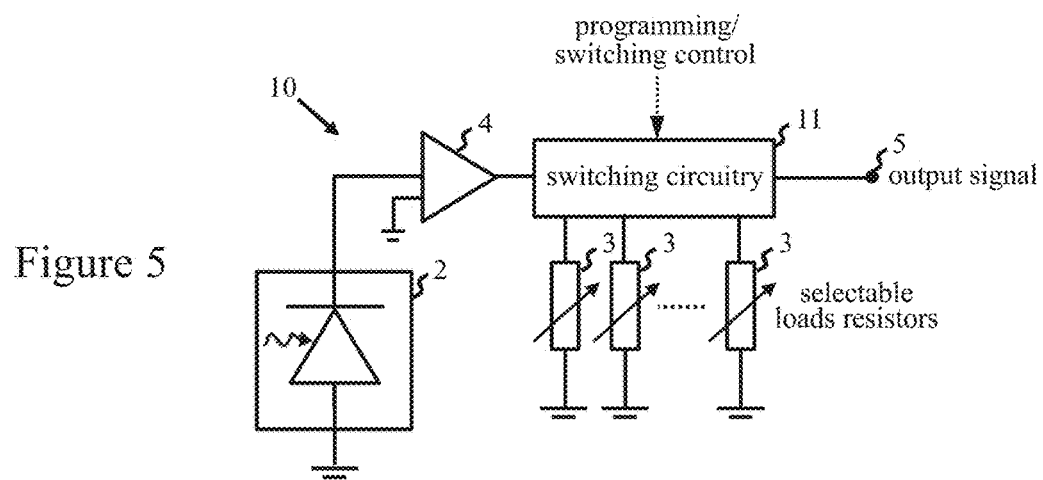
FIG. 5 shows another embodiment with switching circuitry for selective connection of different memory elements in a sensor circuit.

CSU's embodying the invention may include a plurality of programmable non-volatile memory elements each operable in the sensor circuit as a load resistor for the sensor device. FIG. 5 shows one such implementation, again for the basic circuit configuration of FIG. 1. This CSU 10 has a plurality of memory elements 3 which are selectively connectable in the sensor circuit as a load resistor for sensor device 2. Switching circuitry 11 is responsive to switching control signals from a controller (not shown in this figure) to connect a selected memory element 3 in the sensor circuit. The switching circuitry 11 can also selectively connect each memory element to the controller for programming individual elements to desired resistance values. Different load resistors can thus be switched into the sensor circuit to adapt the CSU operation to different requirements.

While simple CSU circuits are described above, CSUs may include other circuit elements, such as additional resistors, capacitors, and/or bias voltages, and may have various other circuit arrangements. Further examples of CSU circuits will be described below. Also, CSUs may in general use any type of sensor device 2, such as sound, motion, temperature, pressure, chemical (e.g., gas), and tactile sensors, as well as other photosensor devices such as phototransistors.

Figure 6:
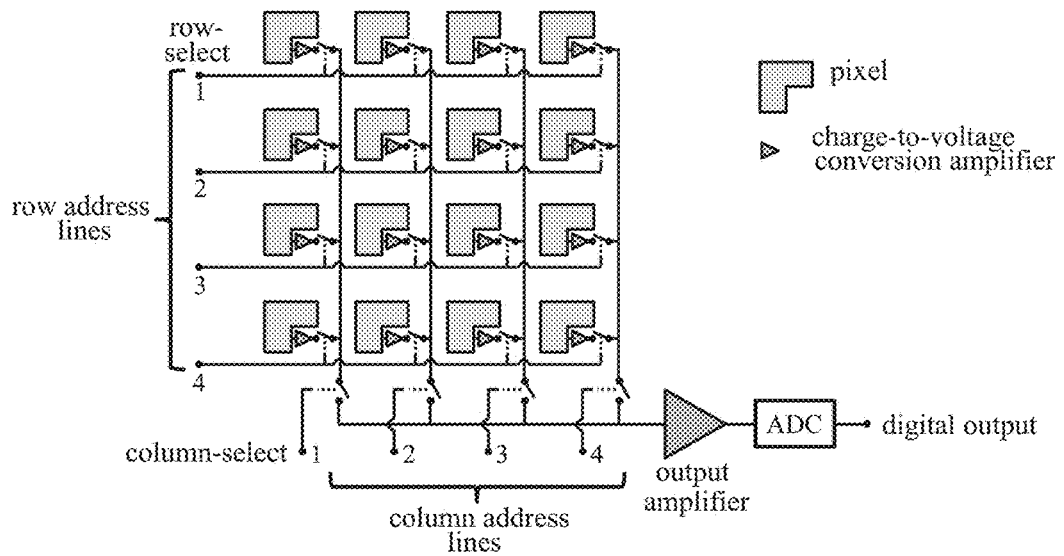
FIG. 6 is a schematic representation of a conventional image sensor array.

A CSU embodying the invention may be a component of sensor apparatus comprising an assemblage of such units. FIG. 6 is a simplified schematic of a conventional image sensor. This sensor comprises an array of pixel units arranged in a cross-bar configuration having row lines and column lines (alternatively "word lines" and "bit lines") for addressing respective rows and columns of pixel units. Each pixel unit stores a charge dependent on incident light. When a given pixel is addressed (by application of row- and column-select signals to the corresponding row and column lines) the stored charge is converted to a voltage by an amplifier of the pixel unit, producing a current on the column line. This current is amplified at the sensor output and converted to a digital signal, indicating pixel intensity, by an ADC (analog-to-digital converter). CSUs embodying the invention can be similarly configured in a cross-bar arrangement, and an example of such apparatus is illustrated in FIG. 7.

Figure 7:
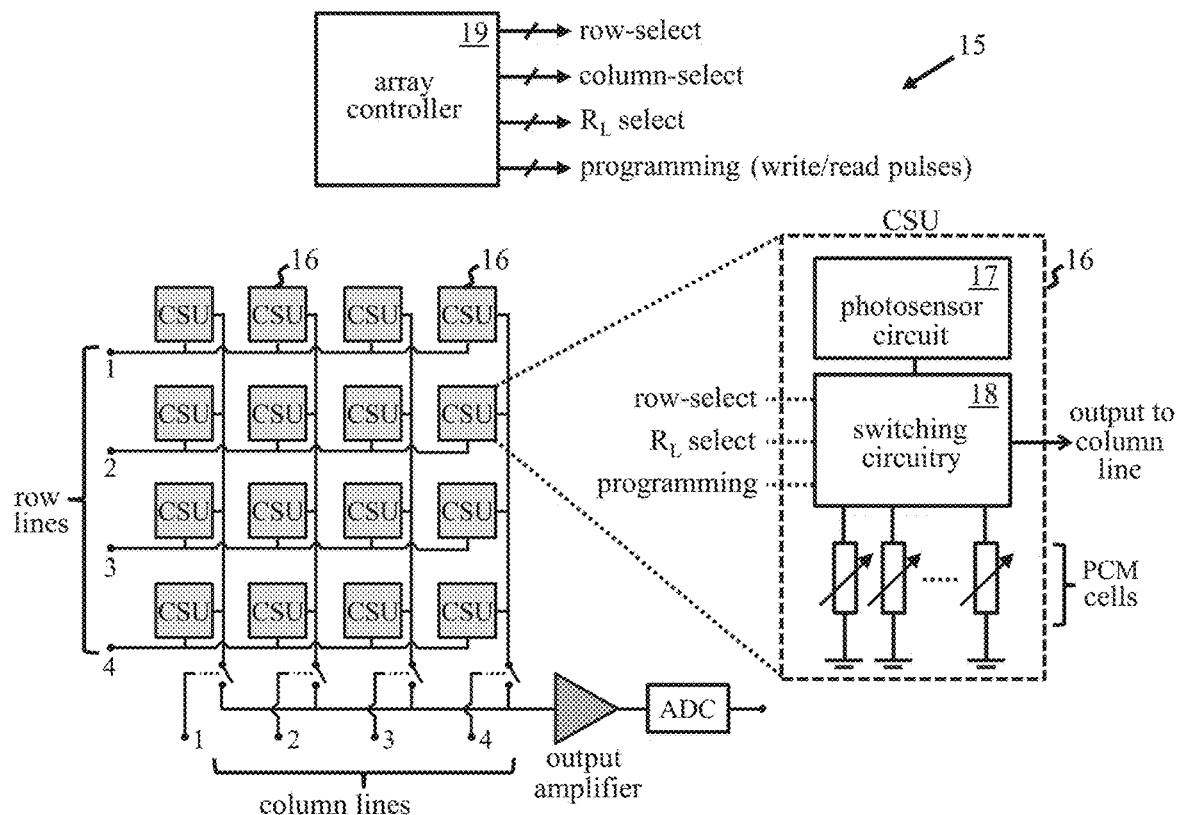
FIG. 7 is a schematic representation of a computational sensor apparatus embodying the invention.

The FIG. 7 schematic shows an image sensor 15 comprising a plurality of CSUs 16 configured in a cross-bar topology (here a simplistic 4-by-4 array) similar to FIG. 6. As in FIG. 6, the cross-bar array has row and column lines for addressing respective rows and columns of CSUs 16 to obtain the output signal from each unit. In this example, the sensor 15 has an output amplifier and ADC for outputting digital signals for further processing. In alternative embodiments, column lines may be otherwise connected to subsequent processing units as exemplified by examples below.

The structure of each CSU 16 is illustrated schematically in the enlargement of FIG. 7. This CSU 16 is based on the general structure of FIG. 5 and comprises a photosensor circuit 17 (with photosensor and amplifier as in FIG. 5), switching circuitry 18, and a plurality of programmable memory elements (here PCM elements as shown in FIG. 3) which are selectively connectable in the photosensor circuit as a load resistor $R_L$ for the photosensor. In this embodiment, the output signal of a CSU is provided to a column line of the array when that CSU is addressed. The sensor apparatus includes an array controller 19 which generates row- and column-select signals for addressing CSUs, along with control signals ("$R_L$ select") for controlling selection of particular load resistors by the switching circuitry 18 in each CSU. The controller 19 also generates the write and read pulses for programming individual PCM elements of each CSU to required resistance values.

The sensor apparatus 15 can be used as a computational sensor for implementing in-sensor compute functions for processing acquired images in NN architectures, e.g., for inference in cognitive tasks. Using the PCM elements as load resistors for the photosensors allows computation to be performed directly on the signals generated by the photosensors, whereby both sensing (signal generation) and computation (via the programmable load resistors) can be performed locally and without data conversions. In particular, the change in responsivity of the CSUs due to the programmable load resistors is analogous to synaptic weighting operations in a neural network. Using a plurality of memory elements in each CSU allows efficient implementation of in-sensor compute functions for CNNs.

Figure 8:
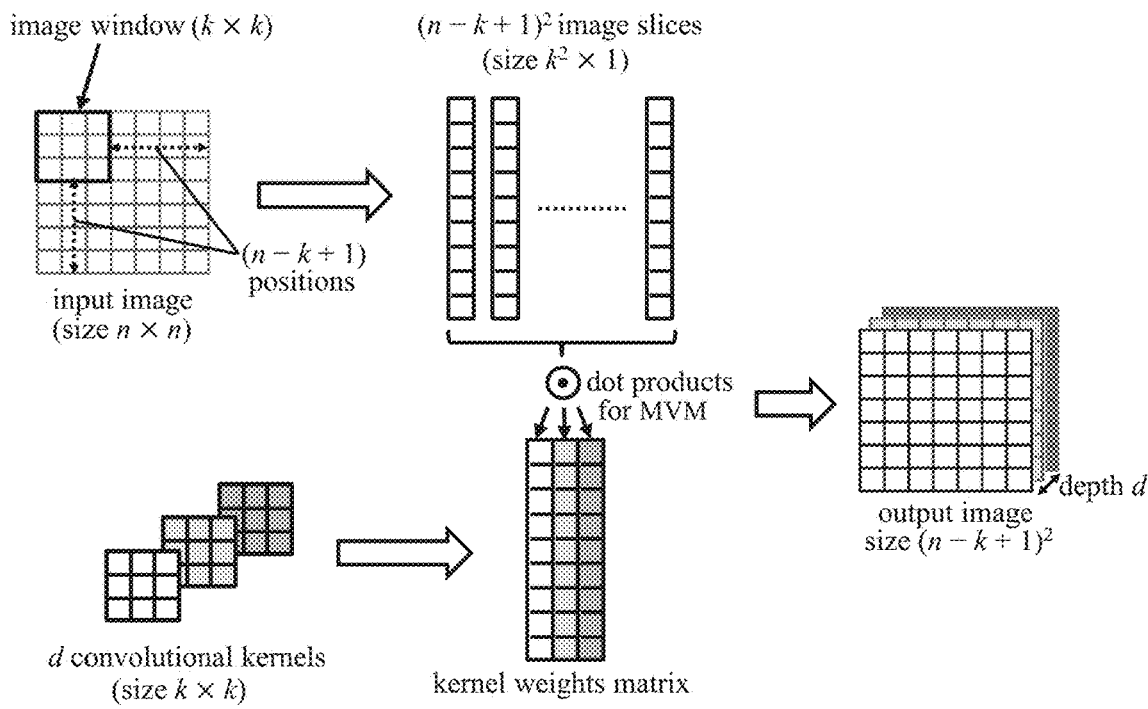
FIG. 8 illustrates steps of a convolution operation in a CNN.

FIG. 8 is a schematic diagram illustrating a convolution operation for an image at the input layer of a CNN. The synaptic layer of a CNN comprises d weight kernels, each comprising k×k weights, as illustrated in the figure. The input image (of size n pixels by n pixels) is processed to produce a set of image vectors ("image slices") for further processing with the convolutional kernels. These image slices are generated by sliding an image window, of size k pixels by k pixels, through positions of the input image. Assuming a stride (window shift) of one pixel, then the image window can assume (n−k+1) positions both horizontally and vertically in the input image. This yields $(n-k+1)^2$ image slices, each comprising a vector of pixels, of dimension $k^2 \times 1$, corresponding to respective window positions. For each image slice, an MVM operation is performed with a matrix of kernel weights formed of d vectors, each comprising the $k^2$ weights of a respective kernel, as illustrated. A dot product is computed between each image slice and each weights vector in the kernel matrix to compute a corresponding point in the output image volume. This results in an output image of $(n-k+1)^2$ points, and depth d, as illustrated. The points of this output image are mapped to neurons in the next network layer for further processing in the CNN.

Figure 9:
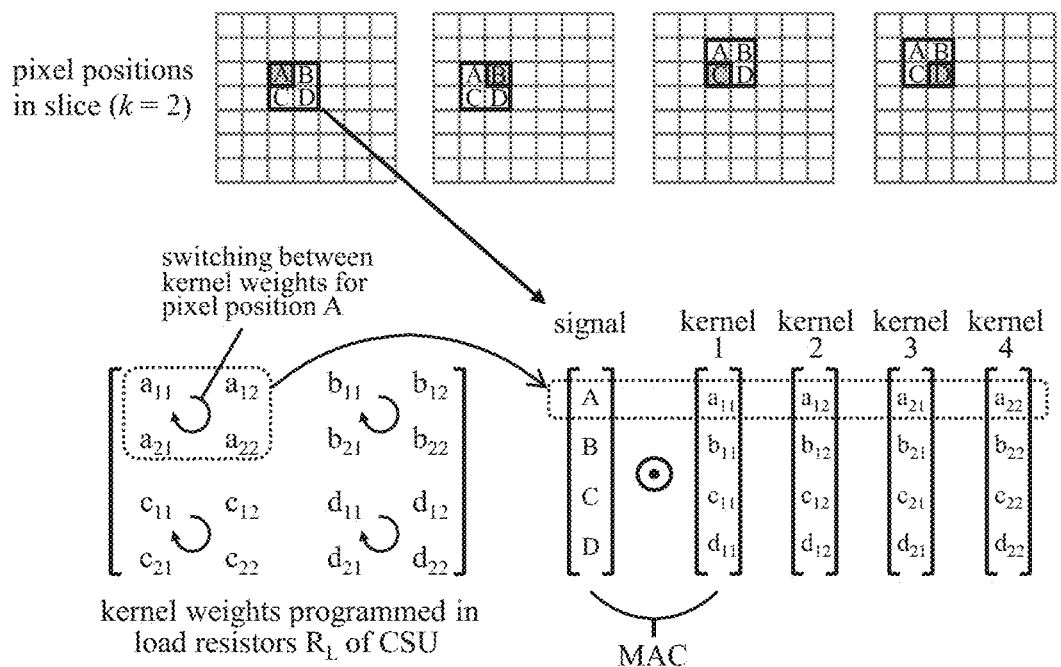
FIG. 9 illustrates switching between memory elements in sensor units of the FIG. 7 apparatus to implement a convolution operation.

FIG. 9 indicates how a convolution operation can be performed in a computational sensor apparatus with the general architecture of FIG. 7. For this convolution, the kernel dimension k=2, the stride s=1, and there are four kernels each with four weights as illustrated by the kernel weights vectors in the figure. Each pixel can assume one of four positions in an image slice (apart from pixels at an edge of the input image). These positions, denoted by A, B, C and D, are illustrated for the shaded pixel at the top of the figure.

To implement this convolution, each CSU 16 includes sixteen PCM cells. The controller 19 programs these cells to states corresponding to respective kernel weights. Hence, each PCM cell stores a respective one of the sixteen kernel weights as indicated in the matrix at the bottom-left of the figure. For each pixel of the input image, the photosensor signal from the corresponding CSU must be multiplied by each of the sixteen kernel weights. This can be achieved by switching each of the PCM cells into the sensor circuit via switching circuitry 18 of the CSU. For example, to perform multiplications for the sensor output at pixel position A in an image slice, the CSU switches between cells storing the four kernel weights $a_{11}$, $a_{12}$, $a_{21}$ and $a_{22}$ as indicated by the dashed rectangles in the figure. Similarly, switching between cells storing weights ($b_{11}$ to $b_{22}$), ($c_{11}$ to $c_{22}$), and ($d_{11}$ to $d_{22}$) performs the multiplications for pixel positions B, C and D respectively.

By controlling addressing of CSUs and switching between kernel weights in individual CSUs, output signals of the CSUs can be combined to provide results for the convolution operation. For a given image slice in the example shown, MAC operations for the dot product calculation with each kernel can be performed by controlling concurrent switching between different sets of kernel weights ($a_{11}$ to $a_{22}$), ($b_{11}$ to $b_{22}$), ($c_{11}$ to $c_{22}$), and ($d_{11}$ to $d_{22}$) in the four CSUs at pixel positions A, B, C and D in that slice. Signals on the column lines are then accumulated to provide results of multiply-accumulate steps of the convolution operation. In this way, MAC/dot product operations can be performed by addressing multiple CSUs, switched to the required weights, in parallel. Multiple MAC operations can also be performed in parallel in some implementations. This is illustrated for a simple example below.

Figure 10:
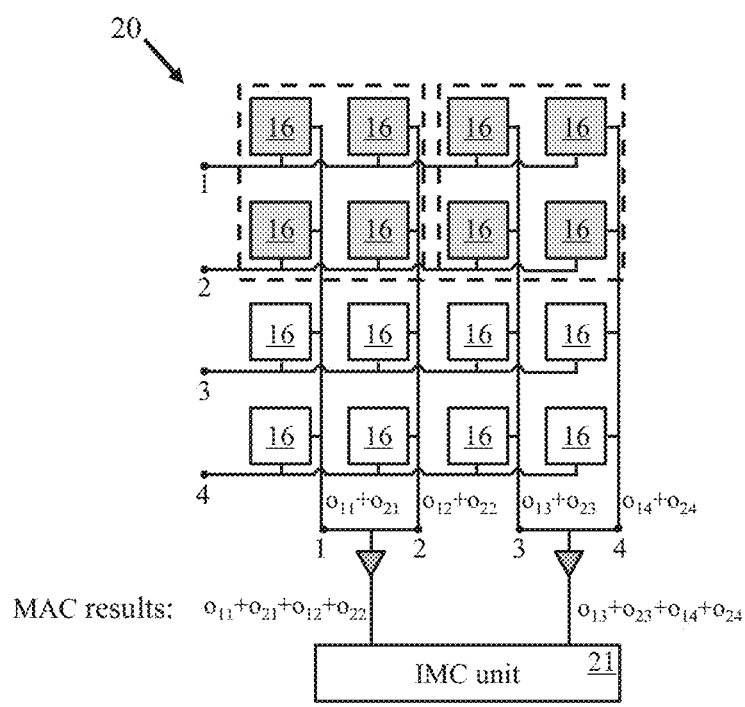
FIG. 10 illustrates MAC operations for a convolution operation in an embodiment of the sensor apparatus.

The FIG. 10 schematic shows an array 20 of 4-by-4 CSUs 16. To perform convolution with 2-by-2 kernels and a stride s=2, as indicated by the dashed windows for the shaded CSUs, the shaded CSUs are addressed via row lines 1 and 2 and column lines 1 to 4. Memory cells storing the weights of a given kernel are selected in the four CSUs of each window. The output signals, denoted by $o_{11}$ and $o_{21}$, from the two CSUs connected to column line 1 are thus accumulated on that column line. Similarly, output signals $o_{12}$ and $o_{22}$ from the two CSUs in the next column are accumulated on column line 2. Column lines 1 and 2 are connected in this embodiment, whereby the column signals are accumulated to provide the MAC result ($o_{11}+o_{21}+o_{12}+o_{22}$). This provides the result of the dot product operation between the corresponding image slice and kernel weights vector. The corresponding result for the second image window is provided in parallel on the combined output of column lines 3 and 4. The resulting signals are then output for further processing in the MVM operation. In this implementation, the analog signals can be supplied directly, without conversion, to word lines of an in-memory compute unit 21 for further processing. In effect, therefore, the computational sensor array constitutes an additional core (or "tile") for the IMC unit, accelerating computation at the input layer of a CNN.

While particular convolution examples are described above, it will be appreciated that convolution calculations can be performed in numerous other ways by appropriate addressing of CSUs, switching schemes for time-multiplexed switching between kernel weights, and accumulation/further processing of output signals on sets of column lines of the array. Since each CSU can be modestly sized (e.g., 10-by-10 μm), multiple kernels can be encoded in multiple load resistors without undue penalty in areal density. Note also that using a stride equal to the kernel vector dimension, i.e. (s=k), limits the required number of PCM cells per CSU to k.

Figure 11:
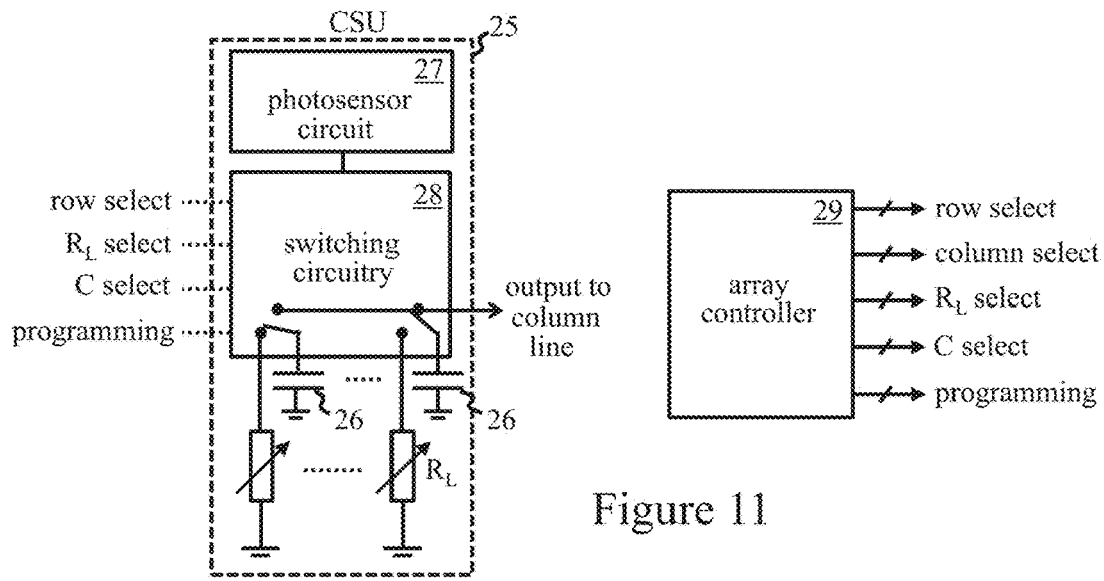
FIG. 11 is a schematic representation of a further embodiment of a configurable sensor unit.

In some embodiments, CSUs may store output signals to facilitate convolution calculations. In particular, the CSU may include, for each memory element, a capacitor for storing a charge dependent on the photosensor signal and the weight stored in that element. FIG. 11 shows an exemplary embodiment. As illustrated schematically here, each memory element of the CSU 25 has an associated capacitor 26. When a memory element is connected in photosensor circuit 27, the associated capacitor is connected to the memory element via switching circuitry 28. The capacitor thus stores a charge dependent on the weighted photosensor signal. Each capacitor is selectively connectable to the output of the CSU in response to a further control signal, "C select", which is supplied to switching circuitry 28 by array controller 29. The stored signals can thus be output to the associated column line in a desired order, offering greater flexibility for convolution calculations.

Figure 12:
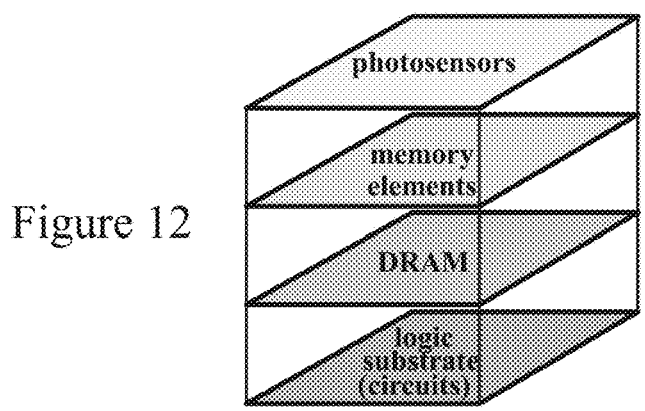
FIG. 12 is a schematic illustrating arrangement of device layers in an integrated sensor apparatus embodying the invention.

It will be appreciated that a cross-bar array of CSUs can be configured in various ways. In preferred embodiments, the memory elements of the various CSUs can be configured in one or more memory arrays (tiles) which can be integrated with standard fabrication methods and topologies used for sensor arrays, such as image sensors. For example, modern back-lit photosensor arrays are manufactured using hybrid bonding techniques. The FIG. 12 schematic illustrates how memory arrays can be readily incorporated in the integrated layer structure of such sensors, offering densely integrated computational sensors compatible with hybrid bonding techniques.

Figure 13:
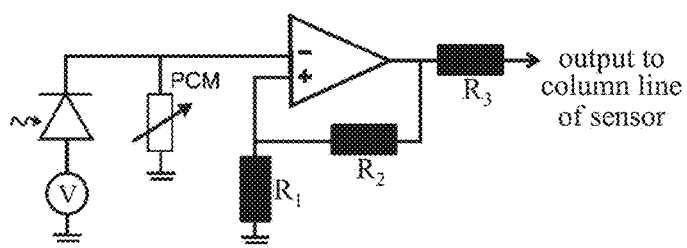
FIGS. 13 through 15 show additional circuit configurations for sensor units embodying the invention.
Figure 14:
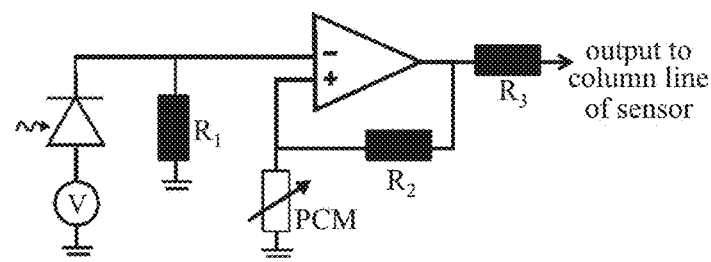
Figure 15:
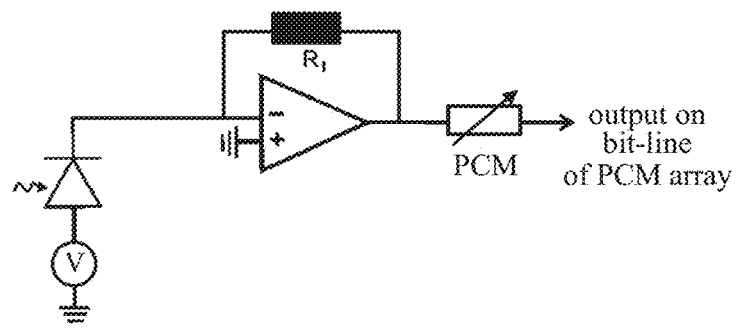

Various other CSU circuits can also be envisaged, and particular examples are shown in FIGS. 13 through 15 (here with a single PCM element for simplicity). In FIG. 13, the photodiode (operated here in bias mode with bias voltage V) serves as a high-impedance current source, and the voltage dropped across the PCM cell is amplified by a gain factor determined by fixed load resistors R1 and R2. The amplifier output voltage produces a current through the fixed load resistor R3 which contributes to the MAC operation on column lines of the sensor array. FIG. 14 shows another arrangement in which the PCM cell implements the weighting operation via the variable gain at the output node of the amplifier. FIG. 15 shows an alternative arrangement in which the photodiode generates a voltage that is scaled by the value of feedback resistor R1. The amplifier output voltage produces a current through the PCM element which can be accumulated on bit-lines of a PCM array for the MAC operation.

Figure 16:
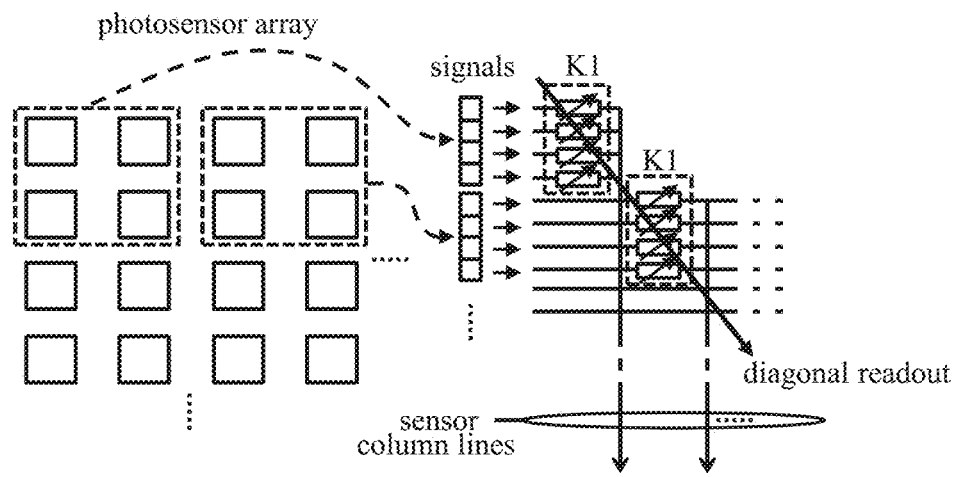
FIGS. 16 and 17 are schematics illustrating signal readout operations for convolution in respective embodiments of the sensor apparatus.
Figure 17:
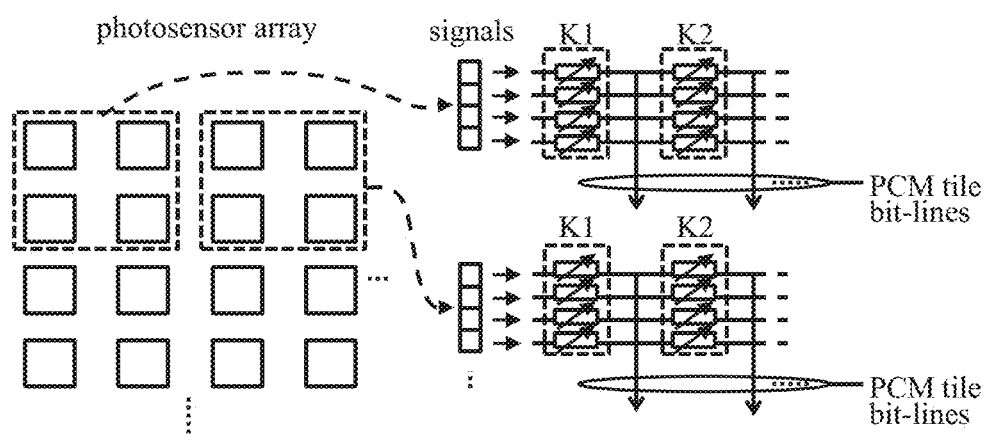

Addressing of CSUs can be controlled in various ways such that output signals of the CSUs provide results of a convolution operation. FIG. 16 illustrates a read-out scheme for convolution using a computational sensor apparatus which performs MAC operations on column lines of the photosensor array. For an image window of 2-by-2 pixels and a stride of s=2, convolutions on an entire row of the image sensor can be performed in parallel, via a diagonal read-out scheme, as indicated schematically in the figure. At any time instant, convolutions can be performed with a single kernel, here K1. Convolution with multiple kernels requires switching between PCM elements in CSUs. Further kernels K2, K3, . . . can be stored in diagonal patterns, beneath that for K1 in the PCM array shown, providing MAC operations for successive kernels on the same column lines. FIG. 17 shows an alternative readout scheme in which MAC operations are performed on bit-lines of PCM cross-bar arrays using the CSU circuit of FIG. 15. Here, convolutions can be performed in parallel for all image windows in a row, with different kernels encoded in different columns of a PCM tile. This allows convolutions with multiple kernels to be performed in parallel at the expense of providing a separate PCM tile for each image window.

Figure 18:
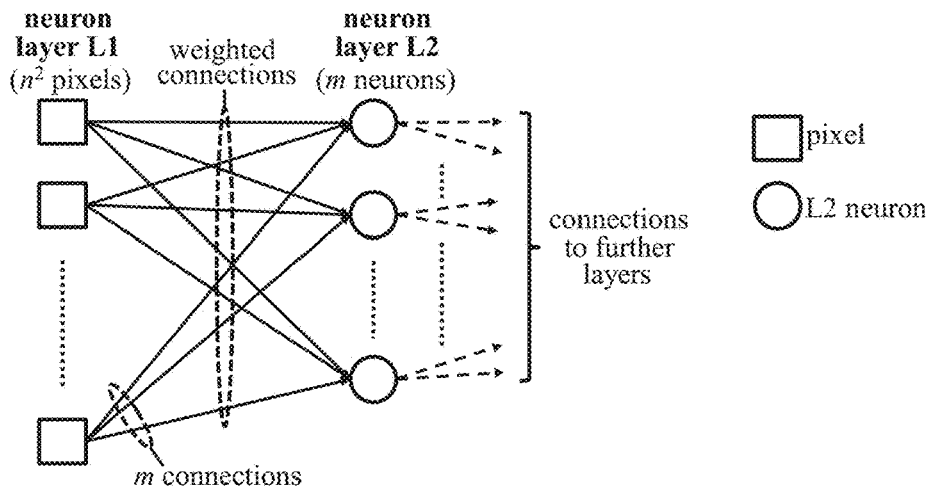
FIG. 18 illustrates operation of an MLP network.

CSUs embodying the invention can be applied in other computational topologies, such as multilayer Perceptrons (MLPs). FIG. 18 illustrates signal propagation at the input of an exemplary MLP. The network inputs, here the $n^2$ pixels of an n-by-n image, represent the output signals of respective (notional) neurons in a first neuron layer L1. Each of these signals is propagated over weighted connections to neurons, here all m neurons, in a second layer L2 of the network. This requires multiplying each pixel value by each of m weights. The weighted signals received by each L2 neuron are then accumulated to provide the input signal to that neuron. This involves m MAC operations for an MVM computation between the n×1 vector of image pixels and the n×m matrix of network weights.

Figure 19:
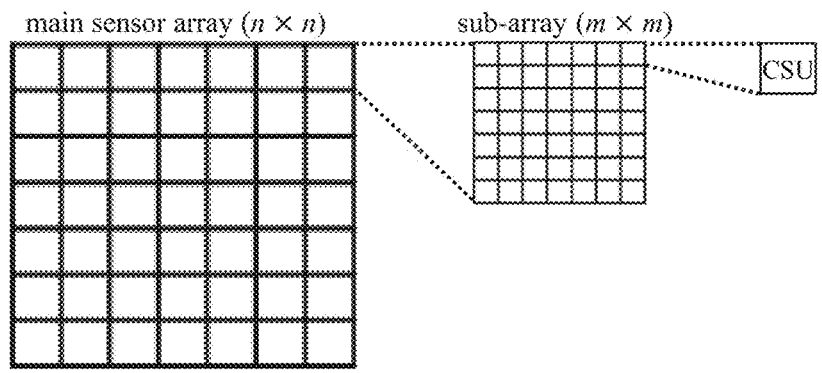
FIG. 19 indicates array structure in an embodiment of computational sensor apparatus implementing an MLP layer.

The above computation can be implemented in a computational image sensor as illustrated schematically in FIG. 19. This sensor comprises a cross-bar array of CSUs, each having a programmable memory element for storing a respective weight of the n×m weights matrix. The CSUs of the main array are grouped into rows and columns of sub-arrays, each comprising m CSUs, as indicated in the figure. The array controller (not shown) is operable to program the memory elements of CSUs in each sub-array to store respective weights such that output signals of CSUs in each sub-array correspond to weighted signals transmitted by a respective neuron in layer L1 to the m neurons in layer L2. Steps of MAC operations for the MVM calculation can be performed by appropriate addressing of the CSUs. In particular, the output signal of each CSU can be provided to a column line of the cross-bar array, and addressing of CSUs is controlled such that signals on the column lines provide results of multiply-accumulate steps which can be further processed, in subsequent processing units, to obtain the final result of the MVM operation.

It will be seen that CSUs embodying the invention offer efficient, readily configurable computational sensor apparatus with in-sensor compute functionality for accelerating computations at the input layers of NN architectures (where computation is most intensive). The operation described offers reduced latency and enhanced energy efficiency due to reduced data movements and conversions and can be integrated with IMC or other processing units for efficient, ultrafast end-to-end performance. This offers significant advantages in numerous applications, such as autonomous driving and edge computing applications generally.

Further embodiments of the invention provide sensor apparatus comprising a CSU generally as described above, and a controller for programming the (or each) memory element of the CSU to a programmed state (or states) dependent on an operating requirement for the CSU. This allows sensor units, with the same basic structure, in different sensor apparatus to be programmed for different operating requirements as appropriate for different applications/operating environments. CSUs of such apparatus may have more than one, individually programmable and individually selectable memory element, for additional configuration options. Programming may be a one-time operation as appropriate for deployment of a particular sensor, or CSUs may be adaptively programmed in dependence on variable operating requirements for a sensor apparatus. Such adaptive sensor apparatus may include an array of CSUs which can be individually programmed. In some embodiments, additional adaptivity can be provided by tuning gains to sense amplifiers of individual CSUs and/or output amplifiers of an array.

Figure 20:
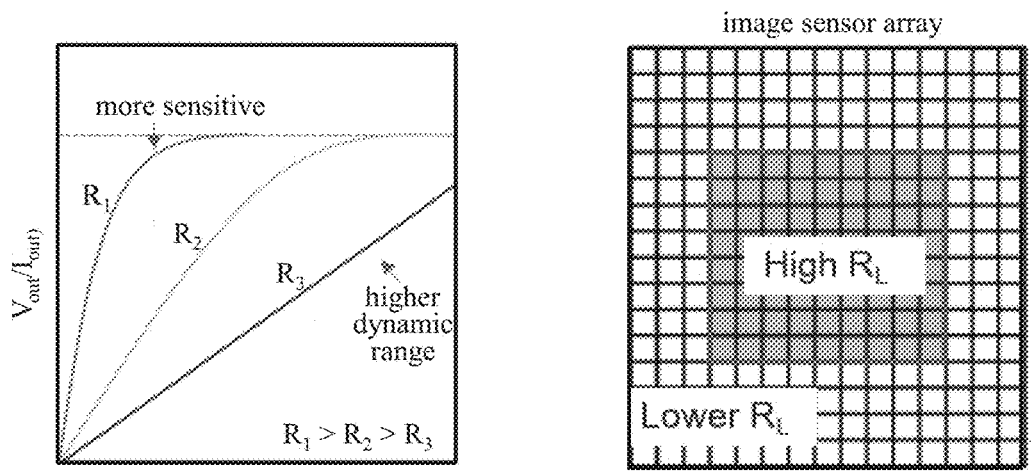
FIG. 20 illustrates structure and operation of an adaptive sensor apparatus embodying the invention.

An illustrative example of adaptive sensor apparatus will be described with reference to FIG. 20. The left-hand plot in this figure shows variation of photosensitivity of the FIG. 1 CSU with different values of the resistance $R_L$. Higher resistance provides a more sensitive CSU, while lower resistance offers increased dynamic range. This can be exploited to provide configurable selection of dynamic range and sensitivity to light detection for each pixel in an image sensor array. For example, units in different regions of the array can be programmed to different resistance values as exemplified by the array on the right of the figure. Again, programming can be adaptive to variable operating requirements such as varying ambient conditions. For example, in bright environmental conditions, large dynamic can be achieved (at the expense of sensitivity) by adaptive programming, and under dark conditions high sensitivity can be achieved (at the expense of dynamic range) for faint signal detection. Notably (and remarkably), this is a phenomenon which mimics the human eye. Using the contractual structure of the pupil, the eye achieves a similar signal modulation functionality. Such adaptive sensor apparatus offers optimal detection in dynamically changing environments. Using PCM elements in such apparatus allows cells to be reprogrammed, and retain their characteristics, over 400,000 times.

It will be appreciated that numerous changes and modifications can made to the particular embodiments described. By way of example, while CSUs have been described with particular reference to photosensors, CSUs may be based on any other type of sensor device. Various other forms of sensor array comprising a plurality of CSUs can also be envisaged. In general, features described with reference one embodiment may be applied to other embodiments as appropriate.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A configurable sensor unit for scalable computational sensor associated with NN (neural network) architectures, comprising:
   a sensor device for generating an electrical signal, dependent on a stimulus sensed by the device, in a circuit;
   a programmable non-volatile memory element operable in the circuit as a load resistor for the sensor device, whereby resistance of the load resistor depends on a programmed state of the memory element, wherein changes to responsivity of the configurable sensor unit is analogous to a synaptic weighting operation; and
   an output for providing an output signal dependent on the electrical signal and the programmed state, wherein the output signal is computed, by the output, locally without any data conversion.

2. The configurable sensor unit in claim 1, the sensor unit including a plurality of programmable non-volatile memory elements which are operable in the circuit as the load resistor for the sensor device.

3. The configurable sensor unit in claim 1, the sensor unit including:
  a plurality of programmable non-volatile memory elements which are selectively connectable in the circuit as a load resistor for the sensor device; and
  switching circuitry for connecting a selected memory element in the circuit in response to a control signal.

4. The configurable sensor unit in claim 1, including switching circuitry for selectively connecting the memory element in the circuit and to a controller for programming the memory element to the programmed state.

5. A sensor apparatus for scalable computational sensor associated with NN (neural network) architectures, comprising a plurality of configurable sensor units, wherein the configurable sensor units comprising:
  a sensor device for generating an electrical signal, dependent on a stimulus sensed by the device, in a circuit;
  a programmable non-volatile memory element operable in the circuit as a load resistor for the sensor device, whereby resistance of the load resistor depends on a programmed state of the memory element, wherein changes to responsivity of the configurable sensor unit is analogous to a synaptic weighting operation; and
  an output for providing an output signal dependent on the electrical signal and the programmed state, wherein the output signal is computed, by the output, locally without any data conversion.

6. The sensor apparatus in claim 5, wherein each sensor unit includes a plurality of programmable non-volatile memory elements which are operable in the circuit as the load resistor for the sensor device of that unit.

7. The sensor apparatus in claim 5, wherein each sensor unit includes:
  a plurality of programmable non-volatile memory elements which are selectively connectable in the circuit as a load resistor for the sensor device of that unit; and
  switching circuitry for connecting a selected memory element in the circuit in response to a control signal.

8. The sensor apparatus in claim 5, wherein each sensor unit includes switching circuitry for selectively connecting the memory element in the circuit and to a controller for programming the memory element to the programmed state.

9. The sensor apparatus in claim 5 wherein the plurality of sensor units are arranged in a cross-bar array having row and column lines for addressing respective rows and columns of sensor units to obtain the output signal from each unit.

10. The sensor apparatus in claim 9 wherein the sensor device of each sensor unit comprises a photosensor.

11. The sensor apparatus in claim 9 including a controller for controlling addressing of sensor units via the row and column lines and for programming memory elements of the sensor units.

12. The sensor apparatus in claim 11 wherein each sensor unit includes switching circuitry for selectively connecting the memory element in the circuit and to the controller for programming the memory element to the programmed state.

13. The sensor apparatus in claim 11 wherein each sensor unit includes a plurality of programmable non-volatile memory elements which are operable in the circuit as a load resistor for the sensor device of that unit.

14. The sensor apparatus in claim 13 wherein:
  the plurality of memory elements of each sensor unit are selectively connectable in the circuit as a load resistor for the sensor device of that unit;
  each sensor unit includes switching circuitry for connecting a selected memory element in the circuit in response to a control signal; and
  the controller is operable to generate the control signal for each sensor unit.

15. The sensor apparatus in claim 14 wherein the output signal of each sensor unit is provided to a column line of the cross-bar array, and wherein the controller is operable:
  to program memory elements of each sensor unit to programmed states corresponding to respective kernel weights of a convolutional neural network layer; and
  to control addressing of sensor units and selective connection, via the control signal for each sensor unit, of each of the plurality of memory elements in the circuit of that unit such that signals on the column lines of the array provide results of multiply-accumulate steps of a convolution operation in the neural network layer.

16. The sensor apparatus in claim 15 wherein each sensor unit includes, for each memory element, a capacitor for storing a charge dependent on the electrical signal and the programmed state of that memory element, the capacitor being selectively connectable to the output for providing the output signal of the sensor unit.

17. The sensor apparatus in claim 13 wherein the controller is operable:
  to program memory elements of each sensor unit to programmed states corresponding to respective kernel weights of a convolutional neural network layer; and
  to control addressing of sensor units such that output signals of the sensor units provide results of a convolution operation in the neural network layer.

18. The sensor apparatus in claim 11 wherein:
  sensor units in the cross-bar array are grouped into rows and columns of sub-arrays each comprising a plurality m of sensor units; and
  the controller is operable to program the memory elements of sensor units in each sub-array to programmed states corresponding to respective weights of a neural network such that output signals of sensor units in each sub-array correspond to weighted signals transmitted by a respective neuron in a first layer of the network to neurons in a second layer of the network.

19. The sensor apparatus in claim 18 wherein the output signal of each sensor unit is provided to a column line of the cross-bar array, and wherein the controller is operable to control addressing of sensor units such that signals on the column lines of the array provide results of multiply-accumulate steps of a matrix-vector multiplication operation in the neural network.

20. The sensor apparatus of claim 5 further comprising:
  a controller for programming the memory element of the sensor unit to a programmed state dependent on an operating requirement for the sensor unit.

21. The sensor apparatus in claim 20 wherein the controller is operable to adaptively program the memory element to different programmed states dependent on variable operating requirements for the sensor unit.

22. A sensor apparatus for scalable computational sensor associated with NN (neural network) architectures comprising:
  an array of configurable sensor units wherein the configurable sensor unit comprising:
    a sensor device for generating an electrical signal, dependent on a stimulus sensed by the device, in a circuit;

a programmable non-volatile memory element operable in the circuit as a load resistor for the sensor device, whereby resistance of the load resistor depends on a programmed state of the memory element, wherein changes to responsivity of the configurable sensor unit is analogous to a synaptic weighting operation;

an output for providing an output signal dependent on the electrical signal and the programmed state, wherein the output signal is computed, by the output, locally without any data conversion; and a controller for programming the memory elements of the sensor units to respective programmed states dependent on an operating requirement for the sensor apparatus.

23. The sensor apparatus in claim 22 wherein the controller is operable to program memory elements of different groups of sensor units to different programmed states dependent on different operating requirements for those sensor units.

24. The sensor apparatus in claim 22 wherein the controller is operable to adaptively program memory elements of the sensor units to different programmed states dependent on variable operating requirements for the sensor apparatus.

25. The sensor apparatus in claim 22 wherein the sensor device of each sensor unit comprises a photosensor.

* * * * *